(12) United States Patent
Durant et al.

(10) Patent No.: US 7,275,380 B2
(45) Date of Patent: Oct. 2, 2007

(54) THERMAL MANAGEMENT SYSTEM AND METHOD

(75) Inventors: Dan Durant, Thornton, CO (US); Jeff Sorge, Westminster, CO (US); Richard Garcia, Nederland, CO (US)

(73) Assignee: Artesyn Technologies, Inc., Boca Raton, FL (US)

( * ) Notice: Subject to any disclaimer, the term of this patent is extended or adjusted under 35 U.S.C. 154(b) by 256 days.

(21) Appl. No.: 10/810,008

(22) Filed: Mar. 26, 2004

(65) Prior Publication Data

US 2005/0210896 A1 Sep. 29, 2005

(51) Int. Cl.
*F25D 17/02* (2006.01)
*G05B 13/00* (2006.01)
*H02H 7/08* (2006.01)
*G01M 1/38* (2006.01)

(52) U.S. Cl. .................. 62/178; 236/DIG. 9; 700/278; 700/299; 318/471

(58) Field of Classification Search .................. 62/186; 700/299, 300, 277, 278; 361/695, 688, 687; 236/DIG. 9; 417/32, 45; 318/471, 268
See application file for complete search history.

(56) References Cited

U.S. PATENT DOCUMENTS 5,528,229 A * 6/1996 Mehta ........................ 340/3.4

OTHER PUBLICATIONS

Cruse, E., "An Integrated Thermal Architecture For Thermal Management Of High Power Electronics," Cooling Zone's Monthly Online Magazine, vol. 3, No. 1, Jan. 2003, available on Apr. 15, 2004 at http://www.coolingzone.com/Guest/News/NL_JAN_2003/Thermacore/Thermacore_Jan_2003.html.
"Enabling Intelligent Platform Management Interface (IPMI) Through Standard Building Blocks," Intel Corporation White Pater, Jun. 2002, available on Apr. 15, 2004 at http://www.intel.com/platforms/applied/eiacomm/papers/25133701.pdf.
"FEB 30×80×38 MM Series," Delta Electronics, Inc. Online Catalog, p. 32, 2002-2003, available on Apr. 15, 2004 at http://www.delta.com.tw/products/dcfans/pdf/FFB808038.pdf.
Hanrahan, D., "Fan-Speed Control Techniques in PCs," Analog Dialogue, vol. 34, No. 4, Jun.-Jul., 2000, available on Apr. 15, 2004 at http://www.analog.com/library/analogDialogue/archives/34-04/fan/.

(Continued)

*Primary Examiner*—Chen Wen Jiang
(74) *Attorney, Agent, or Firm*—Kirkpatrick & Lockheart Preston Gates Ellis LLP (57) ABSTRACT

A method for determining a fan speed for a fan used to cool a payload is disclosed. The method includes, according to various embodiments, receiving a first signal indicative of a first fan speed and receiving a second signal indicative of a system temperature. The method further includes selecting a temperature setpoint based on the first fan speed and, based on a comparison of the system temperature and the selected temperature setpoint, computing a first fan speed output. A thermal management system and method for determining a speed-setpoint droop characteristic are also disclosed.

12 Claims, 5 Drawing Sheets

OTHER PUBLICATIONS

"IPMI v1.5 Overview," Intel Corporation White Paper, 2001, available on Apr. 15, 2004 at http://developer.intel.com/design/servers/IPMI15Whitepaper.pdf.

Kundert, J., "For Optimal Cooling, Rely On Closed-Loop, Fan-Speed Control," Electronic Design, Jul. 6, 1998, available on Apr. 15, 2004 at http://www.findarticles.com/cf_dis/m316/n16_v46/20929121/print.jhtml.

P. Horowitz and W. Hill, "The Art of Electronics," Cambridge University Press, 1980, 1989, p. 49.

Paparrizos, G., "An Integrated Fan Speed Control Solution Can Lower System Costs, Reduce Acoustic Nose, Power Consumption and Enhance System Reliability," Feb. 12, 2003, Microchip Technology, Inc. Application Note, available on Apr. 15, 2004 at www.microchip.com/download/appnote/thermal/tb063a.pdf.

"PIC16F87X Datasheet," Microchip Technology Inc. Product Datasheet, pp. 57-110, Jan. 30, 2001, available on Apr. 15, 2004 at http://www.microchip.com/download/lit/pline/picmicro/families/16f87x/30292c.pdf.

Stancil, C., "Keeping PCs Cool And Quiet," Compaq Computer Corporation, available on Apr. 15, 2004 at http://www.rob-brownstein.com/assets/Keeping%20PCs%20Cool%20And%20Quiet.pdf.

* cited by examiner

THERMAL MANAGEMENT SYSTEM AND METHOD

BACKGROUND

The present invention is directed generally to systems and methods for implementing a fan-based thermal management system.

Fan-based thermal management systems for dissipating excess heat generated by the circuitry, or "payload," of a host system are well known in the electronic arts. The payload may be, for example, a computer microprocessor and its associated components. For host systems having relatively small thermal loads, constant-speed fans provide an attractive solution in terms of simplicity and low cost. Although such fans are typically sized so that the cooling effect provided exceeds that actually required, the cost of this excess capacity is generally small compared with overall operation costs.

The use of constant-speed fans may not be desirable, however, for host systems in which the thermal load is significant, such as, for example, an enclosure containing multiple servers. The power necessary to operate cooling fans in such applications may represent an appreciable portion of the overall operation costs. Accordingly, eliminating excess thermal cooling capacity by adjusting fan speed to optimally match actual cooling requirements reduces power consumption, and thus operation costs. Additionally, where numerous thermal cooling fans are utilized in close physical proximity to each other, the acoustic noise due to fan operation may be problematic. Adjusting fan to speed to provide optimal cooling thus has the further benefit of quieter system operation.

The robustness of a thermal management system is determined largely by its ability to maintain the temperature stability of the payload over a desired range of ambient temperature. Variable-speed fan control is commonly implemented using a digital controller that is programmed to maintain system temperature at a fixed temperature setpoint. For example, the controller may first measure current fan speed using a tachometer feedback signal. The controller may next measure the system temperature using a temperature sensor. If the controller determines that the system temperature exceeds the temperature setpoint, the controller may increase fan speed slightly, increasing airflow and thus causing the system temperature to decrease. Conversely, if the system temperature is less than the temperature setpoint, the controller may decrease fan speed slightly, reducing airflow and thus allowing the system temperature to increase. In order to determine the amount of speed adjustment necessary, the controller may calculate a new fan speed output based on the temperature error (i.e., the difference between the current system temperature and the temperature setpoint) and the current speed output. The calculated speed output and the measured fan speed are then compared to determine the actual increase or decrease in fan speed required. These steps may be repeated continuously, with a sufficient time delay introduced between iterations to allow the system temperature to sufficiently react to airflow changes. Stable control is achieved when the controller is able to maintain the system temperature about the setpoint with little or no fluctuation.

In a thermal management system implementing the above-described fixed-setpoint control scheme, the ideal speed versus ambient temperature ("speed-temperature") control response would specify a minimum fan speed at or below the lower limit of the ambient temperature range and linearly ramp up a maximum speed at or above the upper limit. For a push-through configuration in which the temperature sensor is located upstream with respect to the payload, the fixed-setpoint controller output can be made to approximate this ideal response using empirical calibration techniques. Use of a fixed setpoint-control scheme in a push-through configuration may still result in significant temperature fluctuations in the downstream payload, however, due to the upstream location of the temperature sensor.

A more robust control thermal management system may be realized through the use of a pull-through configuration in which the temperature sensor is positioned downstream with respect to the payload. Because the measured temperature is a function of both the ambient and payload temperatures, a pull-through configuration would make it possible to better maintain the temperature stability of the payload. However, calibrating the controller to approximate the ideal control response in a pull-through configuration is problematic. In particular, implementing a controller based on the fixed-setpoint design of a push-through configuration results in an unstable controller output that saturates prematurely in response to small temperature changes. Additionally, maximum fan speed occurs at an ambient temperature significantly lower than that specified by the ideal speed-temperature control response. These problems are largely attributable to the constant gain of the fixed-setpoint control scheme.

Accordingly, there exists a need for a system and method for realizing stable fan speed control in a thermal management system having a pull-through configuration.

SUMMARY

In one general aspect, embodiments of the present invention are directed to a method for determining a fan speed for a fan used to cool a payload. According to various embodiments, the method includes receiving a first signal indicative of a first fan speed and receiving a second signal indicative of a system temperature. The method may further include selecting a temperature setpoint based on the first fan speed and computing a first fan speed output based on a comparison of the system temperature and the selected temperature setpoint.

In another general aspect, embodiments of the present invention are directed to a method for determining a speed-setpoint droop characteristic. According to various embodiments, the method includes selecting a range of ambient temperature operation and defining an ideal speed-temperature characteristic for the selected range of ambient temperature operation. The method may further include determining a first approximation of the speed-setpoint droop characteristic and comparing a speed-temperature characteristic associated with the speed-setpoint droop characteristic to the ideal speed-temperature characteristic. Additionally, the method may include iteratively adjusting the speed-temperature characteristic associated with the speed-setpoint characteristic by adjusting the speed-setpoint characteristic such that the speed-temperature characteristic approximates the defined ideal speed-temperature characteristic.

In another general aspect, embodiments of the present invention are directed to a thermal management system. According to various embodiments, the system includes a temperature sensor, at least one fan, and a microcontroller. The microcontroller is in communication with the temperature sensor and the at least one fan. In addition, the microcontroller may receive a first signal indicative of a first fan speed from the at least one fan, and a second signal indicative of a system temperature from the temperature sensor. Based on a comparison of the system temperature and the selected temperature setpoint, the microcontroller may then compute a first fan speed output for the at least one fan.

DESCRIPTION OF THE FIGURES

Various embodiments of the present invention will be described by way of example in conjunction with the following figures, wherein.

DESCRIPTION

Figure 1:
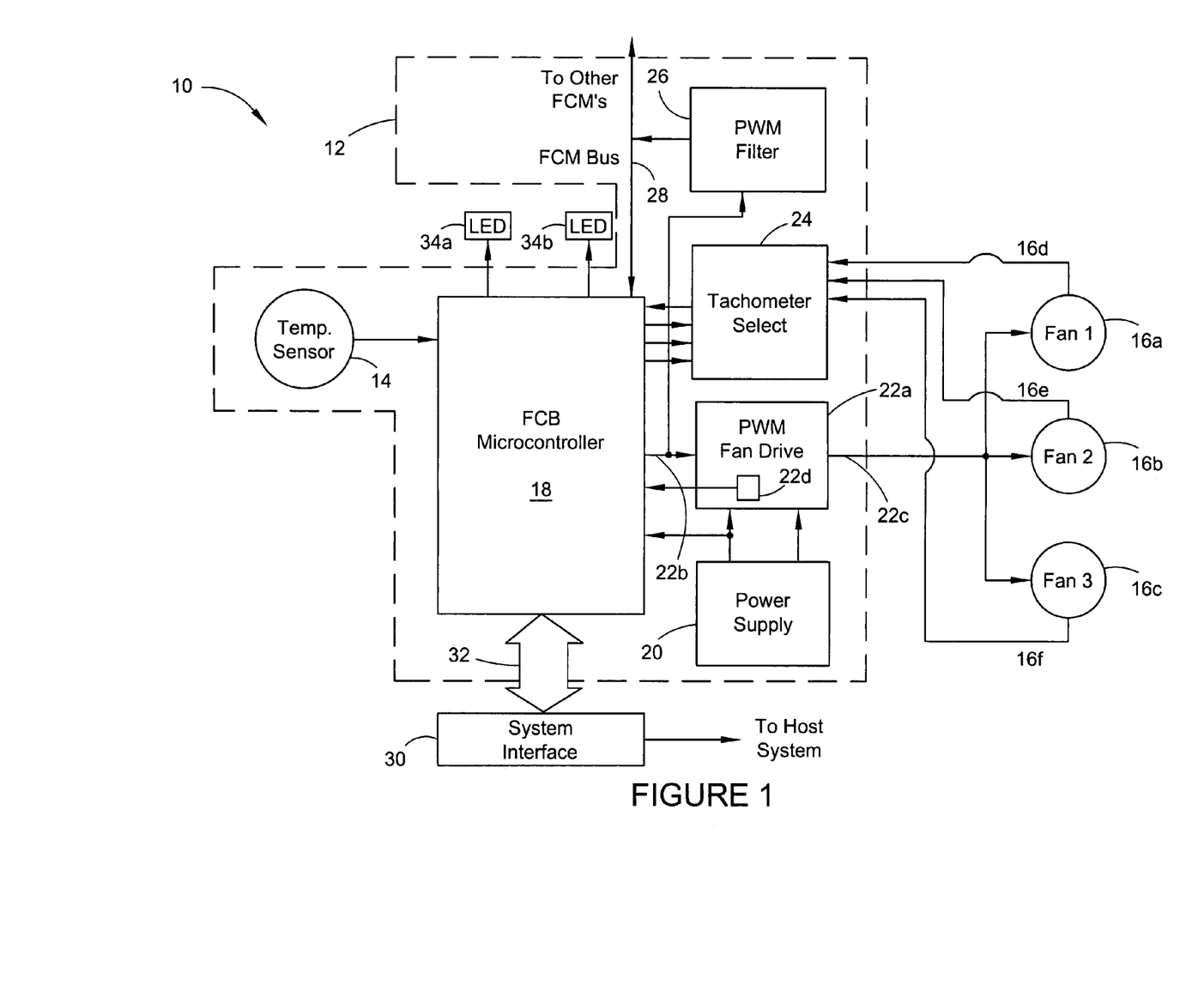
FIG. 1 is a schematic diagram of a fan control module according to various embodiments of the present invention.

FIG. 1 is a schematic diagram of a fan control module (FCM) 10 according to various embodiments of the present invention. The FCM 10 may be implemented, for example, as a rack-mounted fan tray for use in an enclosure that houses multiple servers. As discussed more fully below in connection with FIG. 2, the FCM 10 of FIG. 1 may be one of multiple FCMs installed in a common enclosure and communicatively interconnected via a FCM bus 28. Accordingly, the FCMs may be combined as needed in order to meet the thermal management needs of a particular application. For purposes of clarity, FIG. 1 depicts only one FCM 10 connected to the FCM bus 28.

The FCM 10 may include a fan control board (FCB) 12 and one or more fans 16a-c connected to the FCB 12 for generating airflow to cool a payload. The temperature sensor 14 may be, for example, a NTC thermistor having a known resistance-temperature characteristic. Each fan 16a-c may be a three-wire fan designed for 12 VDC operation, wherein two of the fan wires deliver power to the fan, and the third wire 16d-f provides a pulsed tachometer signal generated by the particular fan that is indicative of its rotational speed. The fans 16a-c may be, for example, a Delta model FFB0812EHE fan available from Delta Electronics, Inc. Three fans are shown in FIG. 1, although it should be recognized that the FCM 10 may include a different number of fans.

The FCB 12 may include a temperature sensor 14, a programmable microcontroller 18, a pulsewidth modulation (PWM) fan drive module 22a, a tachometer select module 24, and a PWM filter module 26. The temperature sensor 14 may be in communication with the microcontroller 18 and provide a temperature signal thereto. The temperature sensor 14 may be, for example, a NTC thermistor having a known resistance-temperature characteristic. Although not shown for purposes of clarity, the microcontroller 18 may include components well known in the microcontroller art such as, for example, a processor, a random access memory (RAM) unit, an erasable programmable read-only memory (EPROM) unit, an interrupt controller unit, timer units, analog-to-digital conversion (ADC) and digital-to-analog conversion (DAC) units, and a number of general input/output (I/O) ports for receiving and transmitting digital and analog signals. As discussed further below, the microcontroller 18 may also include specialized circuits such as, for example, a PWM circuit for generating PWM signals and a communication circuit for enabling communication with other microcontrollers and/or peripheral devices. The microcontroller 18 may be, for example, a PIC16F876 microcontroller available from Microchip Technology, Inc.

The microcontroller 18 of the FCM 10 may be in communication with a system interface 30 via a communication bus 32. The system interface 30 may be externally located with respect to the FCM 10. The system interface 30 may be, for example, a microcontroller system utilizing the intelligent platform management interface (IPMI) standard. The microcontroller 18 and the system interface 30 may exchange control-related data over the communication bus 32 using, for example, the inter-integrated circuit ($I^2C$) communication protocol. The communication bus 32 may also permit the exchange of information necessary to establish, maintain, and monitor communication such as, for example, address bits and a "module present" bit. Tasks performed by the system interface 30 may include, for example, monitoring, analyzing, and storing FCM 10 sensor measurements, providing supervisory control of the FCM 10, and monitoring the operational status of the FCM 10. The system interface 30 may be in further communication with the host system (not shown) via a second communication bus.

The FCB 12 may further include a power supply 20 for providing the necessary power to components comprising the FCM 10. The power supply may be, for example, a dual-voltage power supply, wherein a first voltage output supplies general control power to the FCM 10 and a second voltage output supplies power to the fans 16a-c and to the associated drive circuitry of the PWM drive module 22a.

The microcontroller 18 may execute a programmed control algorithm, discussed more fully below in connection with FIGS. 3 and 4, for adjusting the fan speed of the fans 16a-c based on the system temperature and the current fan speed. Accordingly, a temperature signal indicative of system temperature may be transmitted by the temperature sensor 14 to an analog input of the microcontroller 18. Although not shown for purposes of clarity, the FCM 10 may include signal-conditioning circuitry for converting the output from the temperature sensor 14 into a signal that is compatible with the analog input of the microcontroller 18. The microcontroller 18 may then process the received temperature signal to determine the corresponding system temperature.

The tachometer select module 24 may multiplex the tachometer signals received from the fans 16a-c via the tachometer wires 16d-f. Digital outputs of the microcontroller 18 corresponding in number to that of the fans 16a-c may be used to "pull up" each tachometer signal one at a time, thus allowing the microcontroller 18 to measure the speed of each fan 16a-c using one input. Each speed signal may be in the form of a pulse train, wherein the number of pulses detected by the microcontroller 18 over a fixed time interval is proportional to the current speed of the corresponding fan.

Based upon the system temperature and current fan speed measurements, the microcontroller 18 may generate a speed demand signal corresponding to the desired speed. The speed demand signal may be, for example, a PWM signal generated by a specialized PWM circuit of the microcontroller 18 and having a modifiable period and duty cycle associated therewith. The period and duty cycle of the speed demand signal may be modified, for example, by writing their desired values to dedicated registers contained in the microcontroller 18. The speed demand signal may be communicated to the PWM fan drive 22*a* via signaling link 22*b*. If the speed adjustment as determined by the microcontroller 18 control algorithm calls for an increase in fan speed, the microprocessor 18 may increase the duty cycle of the speed demand signal. Conversely, if decrease in fan speed is required, the microprocessor 18 may decrease the duty cycle of the speed demand signal.

The PWM fan drive 22*a* produces a power output signal in response to the speed demand signal received via signaling link 22*b*. The power output signal may be, for example, a 12 VDC PWM signal having a period and duty cycle identical to that of the speed reference signal. According to various embodiments, the PWM fan drive 22*a* may include MOSFET-based driver circuitry (not shown) for producing the power output signal from the speed reference signal. The power output signal may be transmitted from the PWM fan drive 22*a* to each of the fans 16*a*-*c* via a common power connection 22*c*. Because the PWM fan drive 22*a* may generate considerable heat during operation, the PWM fan drive 22*a* may further include a temperature sensor 22*d* in communication with the microcontroller 18 for providing an indication of over-temperature conditions in the PWM fan drive 22*a*. If an over-temperature condition is detected in the PWM fan drive 22*a*, the microcontroller 18 may respond by generating a speed demand signal that corresponds to the maximum fan speed.

The speed demand signal generated by the microcontroller 18 may also be transmitted to the PWM filter 26 via signaling link 22*b*. The PWM filter 26 may include, for example, an RC filter network (not shown) for generating a scaled filtered speed demand signal, such as, for example, a 0-5 VDC signal, that is proportional to the duty cycle of the received speed demand signal. For example, if the duty cycle of the speed demand signal is such that the fans will run at maximum speed, the filtered speed demand signal would be 5 VDC. Conversely, if the duty cycle of the speed demand signal is such that the fans will run at minimum speed (20 percent duty cycle, for example), the filtered speed demand signal would be about 1 VDC.

The PWM filter 26 may further include a diode gate circuit (not shown) for gating the filtered speed demand signal onto the FCM bus 28. In an arrangement in which multiple FCMs are communicatively interconnected via the FCM bus 28, the diode gate circuit of each PWM filter 26 may pass only the highest of the filtered speed demand signals onto the FCM bus 28. Thus, at any given time during operation, the voltage present on the FCM bus 28 may range from 1-5 VDC (according to the previous example) and be proportional to the highest fan speed being requested by one of the multiple FCMs.

The microcontroller 18 may be connected to the FCM bus 28 and measure the voltage thereon. The microcontroller 18 may then compare the FCM bus 28 voltage to a DC value that is calculated by the microcontroller 18 based on the current PWM duty cycle of the speed demand signal. As discussed below in connection with FIG. 2, if the FCM bus 28 voltage exceeds the calculated DC value by a predetermined threshold, the FCM 10 may become a slave to the FCM bus 30 voltage whereby the speed of its fans will be set by another FCM.

The FCM 10 may further include two indicators 34*a*-*b* for providing a visual indication of operational status. The indicators 34*a*-*b* may be, for example, LEDs controlled by digital outputs of the microcontroller 18. Indicator 34*a* may be, for example, a red LED that is activated to indicate FCM 10 faults such as an electrical short of the FCM bus 28, an over-temperature condition of the PWM fan drive 22*a*, an excessively high system temperature detected by the temperature sensor 14, or a stalled fan 16*a*-*c*. Indicator 34*b* may be a green LED that is activated in the absence of such faults. As discussed below in connection with FIG. 2, a speed demand signal may be generated by the microcontroller 18 to produce maximum fan speed in response to one or a combination of the aforementioned fault examples.

Figure 2:
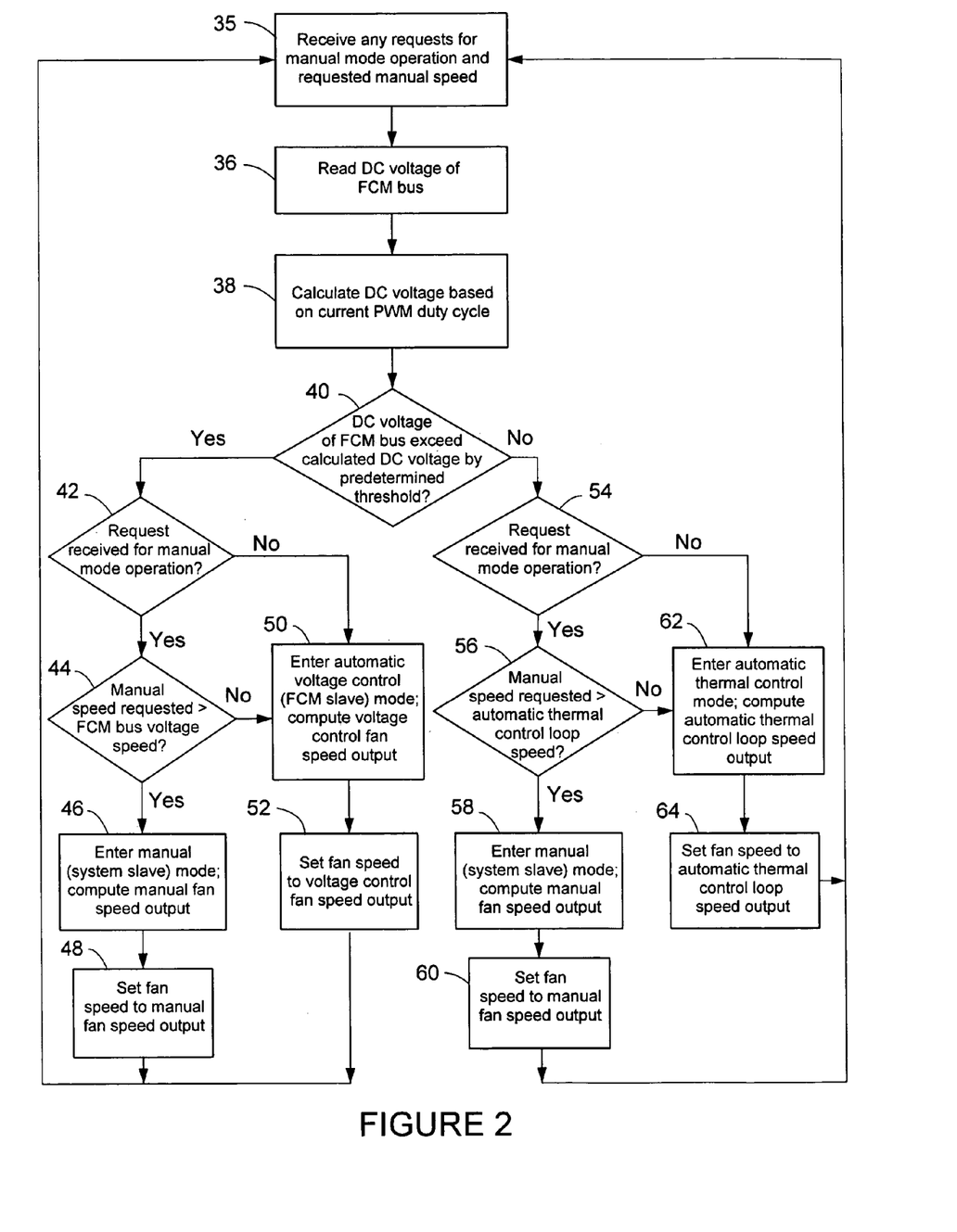
FIG. 2 is a flow diagram illustrating the operational modes of the fan control module according to various embodiments of the present invention.

FIG. 2 is a flow diagram illustrating the operational modes of the FCM 10 according to various embodiments of the present invention. The FCM 10 may be operated in, for example, one of the following modes: (1) automatic thermal control mode, (2) automatic voltage control (i.e., FCM slave) mode, and (3) manual (i.e., system slave) mode. In automatic thermal control mode, the FCM 10 may control fan speed by implementing a closed-loop control algorithm described below in connection with FIGS. 3 and 4, whereby the temperature setpoint is varied according to fan speed. In the automatic voltage control mode, the FCM 10 fan speed may be controlled based upon the voltage present on the FCM bus 28. In this mode, the FCM 10 "follows" the FCM bus 28 voltage and is referred to as a FCM "slave." The FCM providing the highest FCM bus 28 voltage is referred to as the "master." Finally, in manual mode, the FCM 10 fan speed may be controlled in accordance with a manual speed request received from the system interface 30 via the communication bus 32. In this mode, the FCM 10 is referred to as a "slave" of the system interface 30. The automatic thermal control mode will override either or both of the automatic voltage control and manual modes if necessary to satisfy its loop speed output.

Referring to step 35 of FIG. 2, the microcontroller 18 receives any requests for manual mode operation transmitted from the system interface 30 via the communication bus 32. If a request for manual mode operation has been received, the microcontroller may further receive therewith a requested manual speed. At step 36, the microcontroller 18 reads the voltage of the FCM bus 28. As noted above with respect to FIG. 1, the voltage present on the FCM bus 28 may, in various embodiments, range from 1-5 VDC and be indicative of the highest fan speed being requested in a multiple FCM arrangement. At step 38, the microprocessor 18 calculates a DC voltage value based upon the current PWM duty cycle of the speed demand signal. For example, if a 0% duty cycle corresponds to a calculated DC voltage of 0 VDC and a 100% duty cycle corresponds to a calculated DC voltage of 5 VDC, a speed demand signal having a duty cycle of 20% would result in a calculated DC voltage value of 1 VDC. At step 40, the DC voltage read at step 36 and the calculated DC voltage value calculated at step 38 are compared to determine if the FCM bus 28 voltage exceeds the calculated DC voltage value by a predetermined threshold. The size of the predetermined threshold may be dictated by considerations such as, for example, the voltage drop occurring across the diode gate at the output of the PWM filter 26, as well as the need for sufficient hysteresis to prevent cycling.

If the FCM bus 28 voltage exceeds the calculated DC voltage value by the predetermined threshold at step 40, the process continues to step 42. At step 42, the microcontroller 18 determines whether a request for manual mode operation has been received in connection with step 35. If a request for manual mode operation has been received, the microcontroller 18 next determines at step 44 whether the manual speed requested is greater than the speed indicated by the FCM bus 28 voltage. If the manual speed requested is determined to be the higher speed, the FCM 10 will enter manual (system slave) mode and compute a manual fan speed output based on the requested manual speed at step 46, and set the fan speed to the manual fan speed output at step 48. Conversely, if the speed indicated by the FCB bus 28 voltage is determined to be the higher speed, the FCM 10 will enter automatic voltage control (FCM slave) mode and compute a voltage control fan speed output based on the FCB bus 28 voltage at step 50, and set the fan speed to the voltage control fan speed output at step 52. Following either of steps 48 or 52, the process repeats beginning with step 35.

If the FCM bus 28 voltage does not exceed the calculated DC voltage value by the predetermined threshold at step 40, the process advances to step 54 where it is determined whether a request for manual mode operation has been received in connection with step 35. If a request for manual mode operation has been received, the microcontroller 18 next determines at step 56 whether the manual speed requested is greater than the speed indicated by the automatic thermal control loop. If the manual speed requested is determined to be the higher speed, the FCM 10 will enter manual (system slave) mode and compute a manual fan speed output based on the requested manual speed at step 58, and set the fan speed to the manual fan speed output at step 60. Conversely, if the speed indicated by the automatic thermal control loop is determined to be the higher speed, the FCM 10 will enter automatic thermal control mode and compute a automatic thermal control loop speed output at step 62 and set the fan speed to the automatic thermal control loop speed output at step 64. Following either of steps 60 or 64, the process repeats beginning with step 35.

Although not shown in FIG. 2, a failsafe mode exists wherein the FCM 10 fan speed will be set to the highest possible speed. As noted above in connection with FIG. 1, the FCM 10 may enter failsafe mode in response to fault such as an electrical short of the FCM bus 28, an over-temperature condition of the PWM fan drive 22a, an excessively high system temperature detected by the temperature sensor 14, or a stalled fan 16a-c. Other examples of faults that may cause the FCM 10 to enter the failsafe mode include loss of the temperature sensor 14 input or loss of the tachometer feedback signals by the microcontroller 18. The failsafe mode may override any of the other control modes until the fault condition or conditions are resolved.

Figure 3:
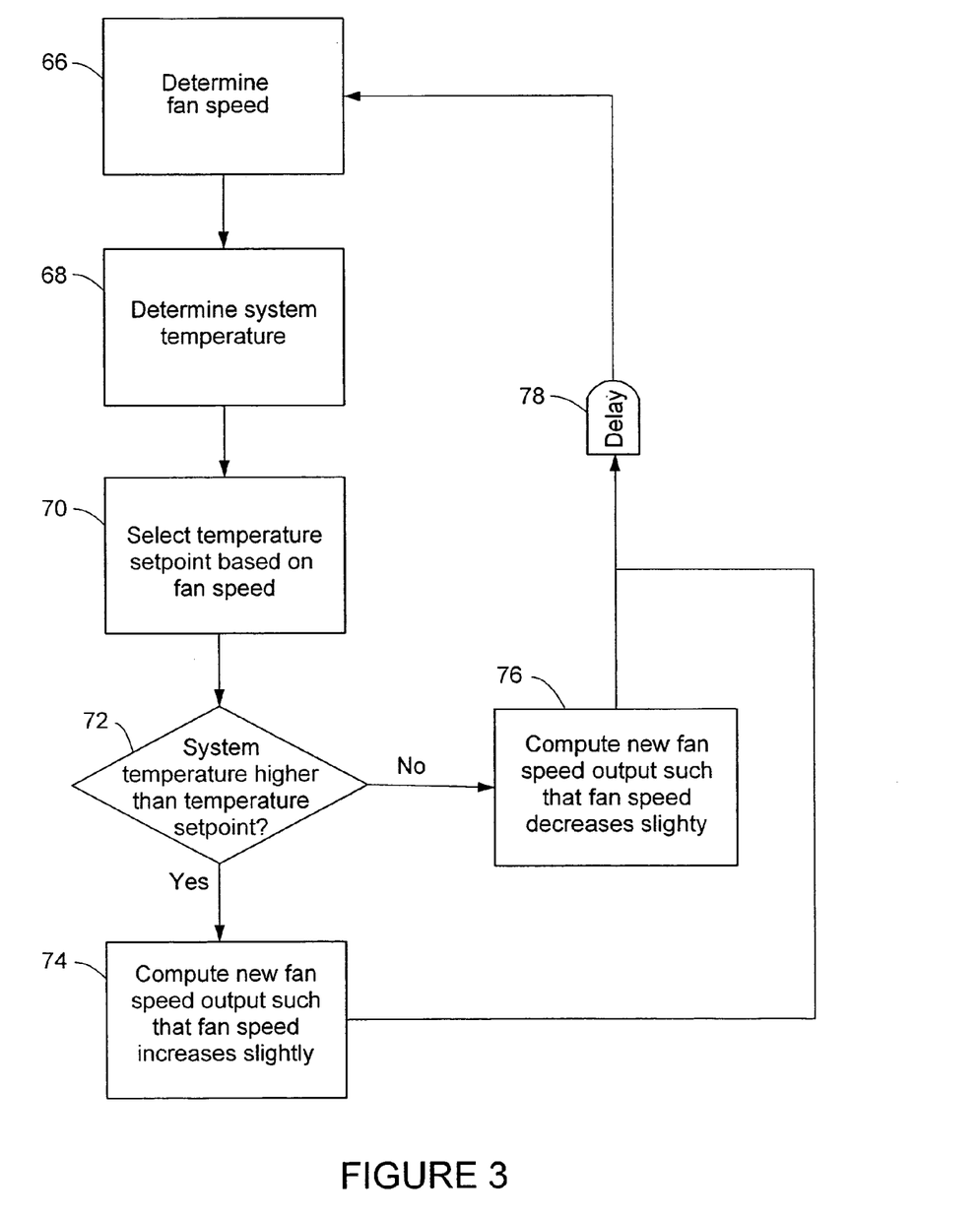
FIG. 3 is a flow diagram illustrating the operation of the automatic thermal control loop of the fan control module according to various embodiments of the present invention.

FIG. 3 is a flow diagram illustrating the operation of the automatic thermal control loop of the FCM 10 according to various embodiments. Unlike the fixed setpoint control scheme discussed above in connection with a push-through configuration, the automatic thermal control loop of FIG. 3 implements a modified setpoint control scheme in which the temperature setpoint is increased and decreased with fan speed in accordance with a predetermined speed-setpoint characteristic. Adjustment of temperature setpoint based on fan speed, referred to as "droop" adjustment, serves to limit control loop gain, thereby avoiding the unstable control problems that result from use of a fixed setpoint controller in a pull-through configuration. The use of speed-setpoint droop characteristic thus allows stable temperature control to be achieved in a pull-through configuration.

Referring to step 66 of FIG. 3, the microcontroller 18 of the FCB 12 may first determine the current fan speed of the FCM 10. Each of the fans 16a-c may operate at slightly different speeds despite being fed by a common power output signal of the PWM fan drive 22a. Accordingly, the microcontroller 18 may first determine the speed of each fan 16a-c using the tachometer select module 24 as discussed above in connection with FIG. 1, and then select the slowest speed as the representative current speed for the FCM 10. At step 68, the microcontroller 18 may determine the system temperature from the temperature signal received from the temperature sensor 14.

At step 70, the microcontroller 18 may select an appropriate temperature setpoint based on the current fan speed determined at step 66. According to various embodiments, this step may be implemented using a look-up table containing a plurality of fan speeds, each having a temperature setpoint associated therewith. The speed-setpoint relationship defined by the look-up table may correspond to the "droop" characteristic discussed above. As discussed below in connection with FIG. 4, values populating the look-up table may be determined empirically by operating the FCM 10 in the host system in a pull-through configuration as a fixed-point controller at predetermined temperatures defining a desired range of ambient operation.

After the droop-compensated temperature setpoint corresponding to the current FCM 10 fan speed has been determined at step 70, the microcontroller 18 at step 72 may compare the temperature setpoint to the system temperature determined at step 68 and compute a new fan speed output based on this comparison. If the system temperature is higher than the droop-compensated temperature setpoint, the microcontroller 18 at step 74 may compute a new fan speed output such that fan speed is increased slightly by increasing the duty cycle of the speed demand signal. Conversely, if determined at step 72 that the system temperature is lower than the droop-compensated temperature setpoint, the microcontroller 18 at step 76 may compute a new fan speed output such that fan speed is decreased slightly by decreasing the duty cycle of the speed demand signal. The amount of fan speed adjustment made by the microcontroller 18 may be proportional to the error between the system temperature and the droop-compensated temperature setpoint. However, in order to prevent large temperature errors from producing large swings in fan 16a-c speed, the microcontroller 18 may clamp the speed adjustment at a maximum value if the error exceeds a predetermined limit. These steps may be continuously repeated, with a sufficient delay introduced between each iteration at step 78 to allow the system temperature sufficient time to react to airflow changes.

Figure 4:
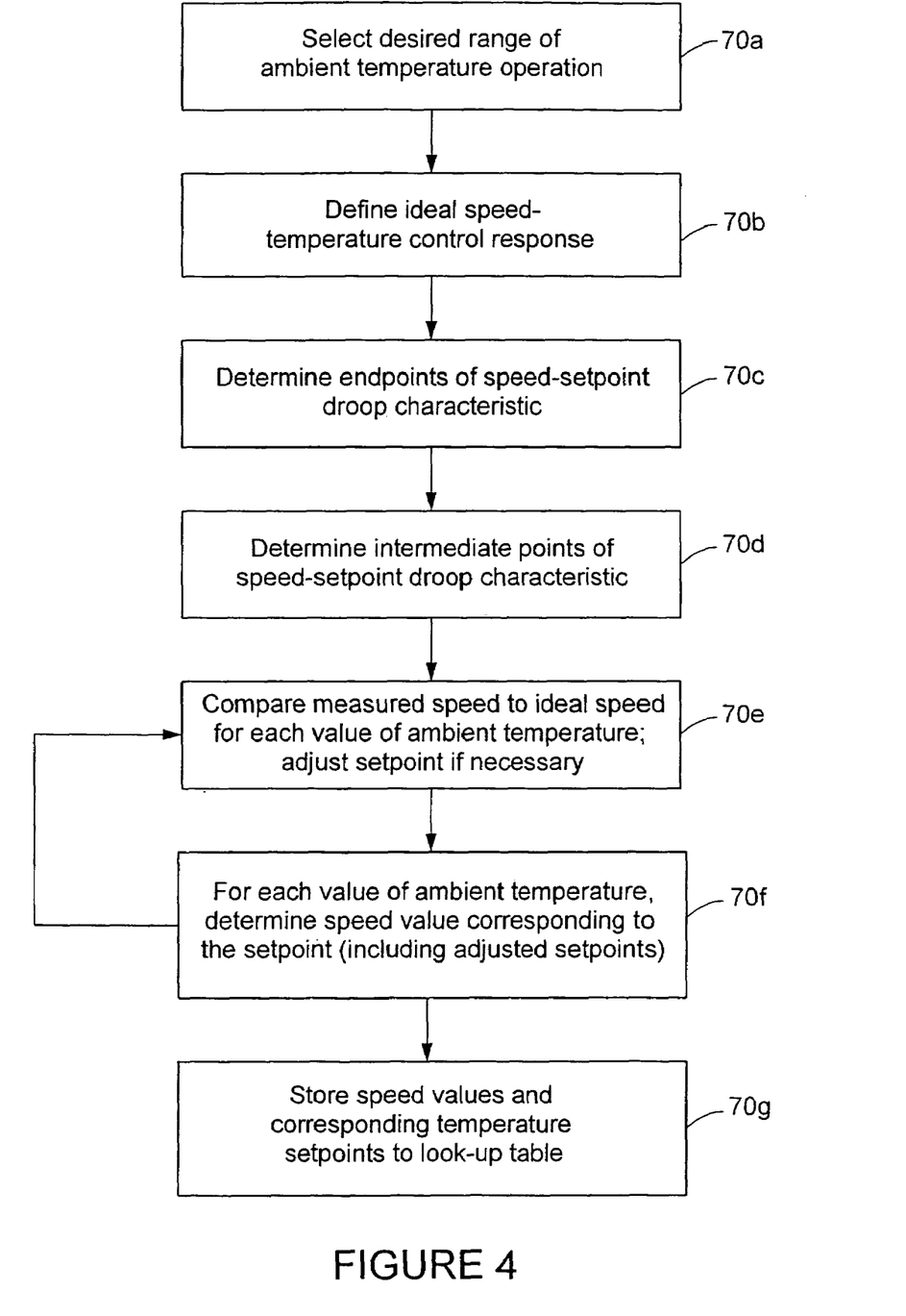
FIG. 4 is a flow diagram illustrating a process that may be used to determine values of the speed-setpoint droop characteristic referenced at step 70 of FIG. 3 according to various embodiments of the present invention.

FIG. 4 is a flow diagram illustrating a process that may be used to determine values of the speed-setpoint droop characteristic referenced at step 70 of FIG. 3 according to various embodiments. Referring to step 70a of FIG. 4, the desired range of ambient temperature over which the controller will operate may be selected based on temperature limitations of the host system. The selected range of ambient temperature operation may be, for example, 25° C. to 45° C.

After selection of the range of ambient temperature at step 70a, the ideal speed-temperature control response may be defined at step 70b. This may be done, for example, by plotting a straight-line approximation between a first endpoint defined by the minimum ambient temperature and the minimum fan speed and second endpoint defined by the maximum ambient temperature and the maximum fan speed. The coordinates of these points may be, for example, (25° C., 3300 RPM) and (45° C., 5700 RPM).

At step 70c, the endpoints of the speed-setpoint droop characteristic are determined. Using a fixed-setpoint controller in a pull-through configuration, the temperature setpoint necessary to begin the fan speed ramp at the minimum ambient temperature may first be determined. Next, the temperature setpoint required to end the fan speed ramp at the upper ambient temperature may similarly be determined. These temperature setpoints and their corresponding speeds may thus establish the endpoints of the speed-setpoint droop characteristic.

At step 70d, an intermediate point of the droop characteristic may be determined by first increasing the ambient temperature and then determining a temperature setpoint and corresponding fan speed at which stable temperature control is achieved. Repeating this step for each of a plurality of ambient temperature values over the range of ambient temperature operation may define a first approximation of the speed-setpoint droop characteristic.

At step 70e, after the temperature setpoint and corresponding speed for each of the plurality of ambient temperatures has been determined in accordance with step 70d, the measured speed-temperature characteristic may be plotted and iteratively adjusted to approximate the ideal speed-temperature control response determined at step 70b. During the first iteration, if the measured speed is greater than the ideal speed for the same value of ambient temperature, the temperature setpoint associated with the measured speed may be slightly increased. This will result in decreased fan speed at the same ambient temperature during future operation. Conversely, if the measured speed is lower than the ideal speed for the same value of ambient temperature, the temperature setpoint associated with the measured speed may be slightly decreased. This will result in increased fan speed at the same ambient temperature during future operation. The end result of these temperature setpoint adjustments is to modify the measured speed-temperature control response to more closely match the ideal speed-temperature control response.

During the second iteration at step 70f, for each value of ambient temperature, the speed corresponding to each temperature setpoint, including the adjusted setpoints, may be determined and the measured speed-temperature control response again plotted. After step 70f, step 70e may be repeated and each temperature setpoint again adjusted (if necessary) to better approximate the ideal speed-temperature control response. This iterative process may be repeated until a close approximation of the ideal speed-temperature control response is achieved. Following the iterative approximation of the ideal speed-temperature control response, the final speed values and corresponding temperature setpoints may be stored to a look-up table contained in the memory of the microprocessor 18, as discussed above.

Figure 5:
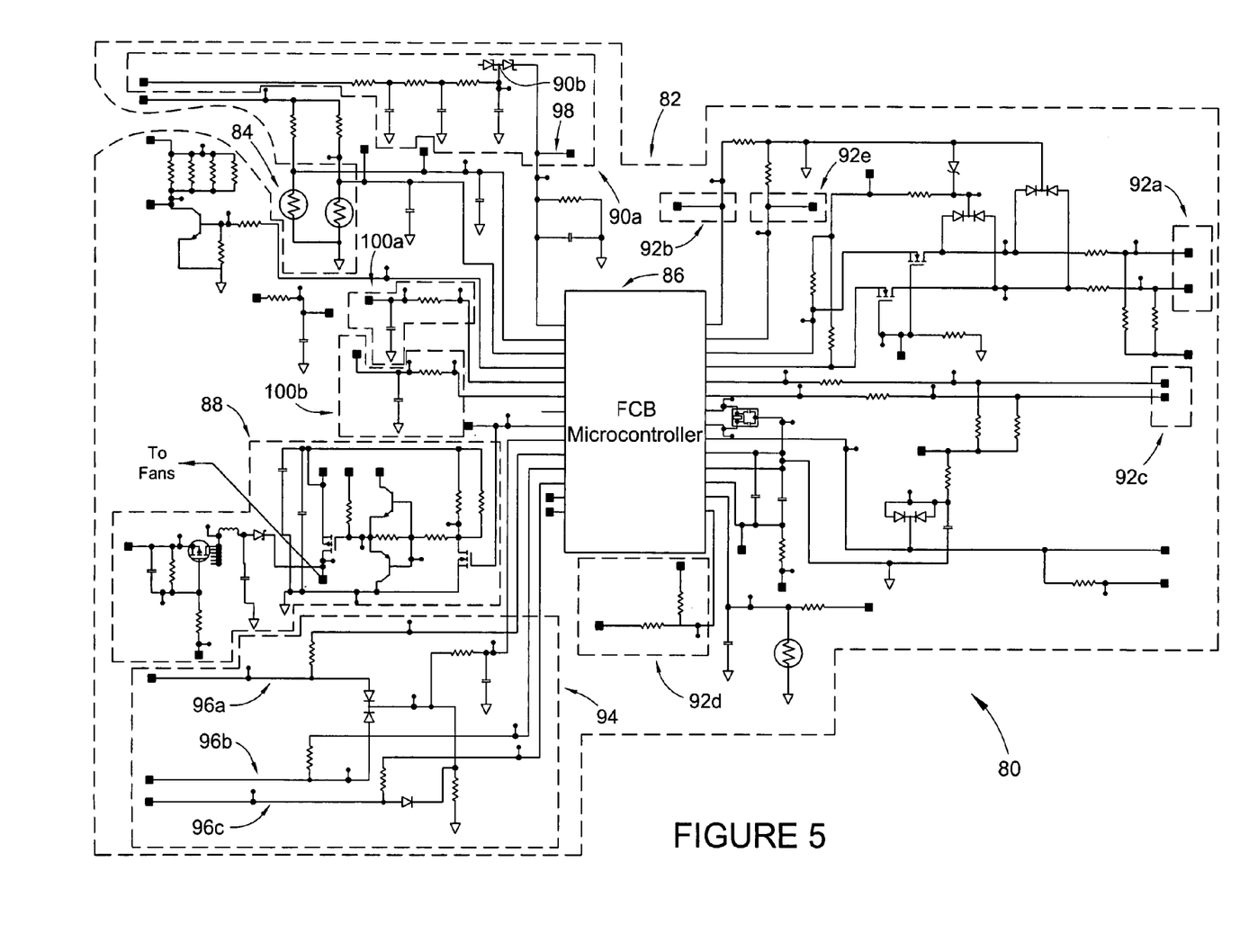
FIG. 5 is an electrical schematic diagram showing aspects of the fan control module of FIG. 1 in a circuit level format according to various embodiments of the present invention.

FIG. 5 is an electrical schematic diagram showing certain aspects of the FCM 10 of FIG. 1 at the circuit level according to various embodiments of the present invention. The FCB 12 and the temperature sensor 14 of FIG. 1 appear as circuits 82 and 84 in FIG. 5 respectively. The microcontroller 18, the PWM fan drive 22a, and the PWM filter module 26 of FIG. 1 appear in FIG. 5 as circuits 86, 88, and 90a respectively, and the diode gate of the PWM filter 26 and the FCB bus 28 connected thereto appear as circuit 90b and associated circuit lead 98 respectively. The communication bus 32 of FIG. 1 includes circuits 92a-d of FIG. 5. The tachometer select module 24 of FIG. 1 appears as circuit 94 of FIG. 5, and tachometer wires 16d-f of FIG. 1 correspond to circuit leads 96a-c of FIG. 5 respectively. Visual indicators 34a-b for providing a visual indication of one or more fault conditions or the lack thereof appear as circuits 100a and 100b respectively.

Whereas particular embodiments of the invention have been described herein for the purpose of illustrating the invention and not for the purpose of limiting the same, it will be appreciated by those of ordinary skill in the art that numerous variations of the details, materials, configurations and arrangement of parts may be made within the principle and scope of the invention without departing from the spirit of the invention. For example, various steps shown in FIGS. 2-4 may be performed in different orders. The preceding description, therefore, is not meant to limit the scope of the invention.

What is claimed is:

1. A method for controlling a speed of at least one fan used to cool a payload of a host system, the method comprising:
   receiving a first signal indicative of a fan speed;
   receiving a second signal indicative of a temperature of the host system;
   selecting a temperature setpoint based on the fan speed using a speed-setpoint droop characteristic, the speed-setpoint droop characteristic comprising a plurality of fan speed values and corresponding temperature setpoint values; and
   computing a fan speed output for controlling the speed of the at least one fan based on a comparison of the host system temperature and the selected temperature setpoint.

2. The method of claim 1, further comprising determining the speed-setpoint droop characteristic prior to selecting the temperature setpoint.

3. The method of claim 2, wherein determining the speed-setpoint droop characteristic comprises:
   selecting a range of ambient temperature operation of the host system;
   defining an ideal speed-temperature characteristic for the range of ambient temperature operation;
   determining a first approximation of the speed-setpoint droop characteristic and a corresponding measured speed-temperature characteristic;
   comparing the measured speed-temperature characteristic to the ideal speed-temperature characteristic; and
   adjusting the first approximation of the speed-setpoint droop characteristic based on the comparison such that the measured speed-temperature characteristic is caused to approximate the ideal speed-temperature characteristic.

4. A method for determining a speed-setpoint droop characteristic for adjusting a temperature setpoint of a temperature control loop based on fan speed, the method comprising:
   selecting a range of ambient temperature operation of a host system, the host system comprising at least one fan controlled by the temperature control loop;
   defining an ideal speed-temperature characteristic for the range of ambient temperature operation;
   determining a first approximation of the speed-setpoint droop characteristic and a corresponding measured speed-temperature characteristic;
   comparing the measured speed-temperature characteristic to the ideal speed-temperature characteristic; and
   adjusting the first approximation of the speed-setpoint droop characteristic based on the comparison such that the measured speed-temperature characteristic is caused to approximate the ideal speed-temperature characteristic.

5. A thermal management system for controlling a temperature within a host system, the thermal management system comprising:
  at least one fan control module (FCM), each FCM comprising:
    a temperature sensor;
    at least one fan; and
    a microcontroller in communication with the temperature sensor and the at least one fan, wherein the microcontroller is for:
      receiving a first signal indicative of a fan speed from the at least one fan;
      receiving a second signal indicative of the host system temperature from the temperature sensor;
      selecting a temperature setpoint based on the fan speed using a speed-setpoint droop characteristic, the speed-setpoint droop characteristic comprising a plurality of fan speed values and corresponding temperature setpoint values; and
      computing a thermal control loop fan speed based on a comparison of the host system temperature and the selected temperature setpoint.

6. The system of claim 5, wherein the speed-setpoint droop characteristic is stored in a memory of the microcontroller.

7. The system of claim 5, further comprising a plurality of FCMs interconnected via a bus, wherein the microcontroller is further for:
  receiving via the bus a third signal indicative of a highest thermal control loop fan speed of the FCMs.

8. The system of claim 7, wherein the microcontroller is further for:
  receiving a fourth signal indicative of a manual fan speed.

9. The system of claim 8, wherein the microcontroller is further for generating a speed demand signal based upon one of the thermal control loop fan speed, the highest thermal control loop fan speed of the FCMs, and the manual fan speed.

10. The system of claim 9, wherein the speed demand signal is a PWM signal having a period and a duty cycle associated therewith.

11. The system of claim 10, wherein the microcontroller is further for calculating a voltage value based upon the duty cycle of the speed demand signal.

12. The system of claim 10, further comprising:
  a PWM fan drive for receiving the speed demand signal and generating a power output signal in response thereto, wherein the power output signal is transmitted to the at least one fan.

* * * * *